US012713651B2

(12) United States Patent
Yen et al.

(10) Patent No.: US 12,713,651 B2
(45) Date of Patent: Aug. 18, 2026

(54) SILICON CARBIDE SEMICONDUCTOR DEVICE

(71) Applicant: Fast SiC Semiconductor Incorporated, Hsinchu City (TW)

(72) Inventors: Cheng-Tyng Yen, Hsinchu City (TW); Hsiang-Ting Hung, Hsinchu City (TW); Fu-Jen Hsu, Hsinchu City (TW)

(73) Assignee: FAST SIC SEMICONDUCTOR INCORPORATED, Hsinchu City (TW)

( * ) Notice: Subject to any disclaimer, the term of this patent is extended or adjusted under 35 U.S.C. 154(b) by 374 days.

(21) Appl. No.: 18/490,975

(22) Filed: Oct. 20, 2023

(65) Prior Publication Data

US 2024/0136436 A1 Apr. 25, 2024
US 2024/0234569 A9 Jul. 11, 2024

Related U.S. Application Data

(60) Provisional application No. 63/437,749, filed on Jan. 8, 2023, provisional application No. 63/418,603, filed on Oct. 23, 2022.

(51) Int. Cl.
*H01L 29/78* (2006.01)
*H01L 29/06* (2006.01)
(Continued)

(52) U.S. Cl.
CPC ......... *H10D 30/668* (2025.01); *H10D 62/105* (2025.01); *H10D 62/127* (2025.01); *H10D 62/393* (2025.01); *H10D 62/8325* (2025.01)

(58) Field of Classification Search
CPC .. H10D 30/668; H10D 62/105; H10D 62/127; H10D 62/393; H10D 62/8325;
(Continued)

(56) References Cited

U.S. PATENT DOCUMENTS 9,997,599 B2 6/2018 Cooper
11,404,542 B2 8/2022 Rahimo et al.
(Continued)

FOREIGN PATENT DOCUMENTS

WO 2021053906 3/2021

*Primary Examiner* — Tong-Ho Kim
(74) *Attorney, Agent, or Firm* — MUNCY, GEISSLER, OLDS & LOWE, P.C.

(57) ABSTRACT

A silicon carbide semiconductor device comprises a silicon carbide substrate, a drift layer, a plurality of first doped regions, a plurality of second doped regions, a plurality of third doped regions, a plurality of trenches and a gate electrode. The first doped regions are disposed in the drift layer and form a plurality of first p-n junctions and a plurality of JFET regions with the drift layer. The second doped regions are disposed within the first doped regions and form a plurality of second p-n junctions with the first doped regions. The third doped regions are disposed in the first doped regions and adjacent to the second doped regions. The trenches penetrate into the drift layer and run horizontally through the JFET regions. The gate electrode is disposed over a main surface and in the trenches, which is electrically isolated from the drift layer by a gate insulating layer.

11 Claims, 14 Drawing Sheets

(51) Int. Cl.

| | |
|---|---|
| ***H01L 29/10*** | (2006.01) |
| ***H01L 29/16*** | (2006.01) |
| ***H10D 30/66*** | (2025.01) |
| ***H10D 62/10*** | (2025.01) |
| ***H10D 62/17*** | (2025.01) |
| ***H10D 62/832*** | (2025.01) |

(58) Field of Classification Search

CPC ............. H10D 30/0297; H10D 30/662; H10D 62/107; H10D 62/157

See application file for complete search history.

(56) References Cited

U.S. PATENT DOCUMENTS

2004/0145011 A1* 7/2004 Hsu ........................ H10D 30/63 257/E29.104
2016/0099316 A1* 4/2016 Arai ..................... H10D 62/107 257/77
2021/0202724 A1 7/2021 Rahimo
2021/0257460 A1* 8/2021 Rahimo ............... H10D 12/441
2021/0343834 A1* 11/2021 Lichtenwalner ..... H10D 62/107

* cited by examiner

SILICON CARBIDE SEMICONDUCTOR DEVICE

CROSS REFERENCE TO RELATED APPLICATIONS

The present application claims priority to U.S. Provisional Patent App. No. 63/418,603, filed Oct. 23, 2022 and U.S. Provisional Patent App. No. 63/437,749, filed Jan. 8, 2023, the entirety of which are incorporated by reference herein.

FIELD OF THE INVENTION

The present disclosure relates to a silicon carbide semiconductor device and more particularly to a silicon carbide semiconductor device with a hybrid gate structure.

BACKGROUND OF THE INVENTION

Silicon carbide (SiC) power devices have emerged as a promising material for power transistors in power conversion applications. Power transistors include metal-oxide-semiconductor field effect transistors (MOSFET), insulated gate bipolar transistors (IGBT), heterostructure field effect transistors (HFET), junction field effect transistors (JFET) and high electron mobility transistors (HEMT). SiC power transistors such as SiC MOSFETs have the advantages of high input impedance, lower driving loss, lower on-resistance, high blocking voltage, lower switching loss, faster switching speed, and larger safe operating area compared to their silicon counterparts.

One of the key considerations of SiC MOSFET is to reduce the on-resistance in a specified area. The total on-resistance of SiC MOSFET includes channel resistance, JFET resistance, contact resistance, drift resistance and substrate resistance. The active area of SiC MOSFET is comprised by an array of unit cells, and one of strategies to reduce the total on-resistance is to increase the channel width density to reduce channel resistance by reducing the cell pitch. However, the JFET resistance will increase with a narrow JFET region of reduced cell pitch. To avoid the increased JFET resistance exceeds the reduced channel resistance, a current spreading layer (CSL), which is a layer with a doping concentration higher than the drift layer, is usually introduced to mitigate the JFET effect. The JFET resistance reduces with increasing doping concentration of CSL, but the blocking voltage will be reduced if the doping concentration of CSL is too high. To reduce on-resistance by reducing the cell pitch needs optimizing the trade-off between CSL doping and blocking voltage and requires better process control, which pose a challenge to manufacturing SiC MOSFET with high yield.

SUMMARY OF THE INVENTION

According to some embodiments described herein, a silicon carbide semiconductor device includes a silicon carbide substrate, a drift layer, a plurality of first doped regions, a plurality of second doped regions, a plurality of third doped regions, a plurality of trenches and a gate electrode. The drift layer of a first conductivity type is disposed on the substrate. The plurality of first doped regions of a second conductivity type opposite to the first conductivity type is disposed in the drift layer, and the first doped regions comprise a plurality of first sub-portions and a plurality of first extending portions extended horizontally along a first horizontal direction from the first sub-portions.

The plurality of first doped regions form a plurality of first p-n junctions and a plurality of JFET regions with the drift layer. The plurality of second doped regions of the first conductivity type are disposed within the first doped regions, and comprise a plurality of second sub-portions and a plurality of second extending portions extended horizontally along the first horizontal direction from the second sub-portions. The plurality of second doped regions form a plurality of second p-n junctions with the first doped regions. A plurality of channel regions are provided between the first p-n junctions and the second p-n junctions along a main surface of the drift layer. The plurality of third doped regions of the second conductivity type are disposed in the first sub-portions of the first doped regions and adjacent to the second sub-portions of the second doped regions. The plurality of trenches penetrate from the main surface into the drift layer. The plurality of trenches run horizontally through at least part of the JFET regions. The gate electrode is disposed on the main surface and in the trenches. The gate electrode is electrically isolated from the drift layer by a gate insulating layer.

DETAILED DESCRIPTION OF THE PREFERRED EMBODIMENTS

Figure 1:
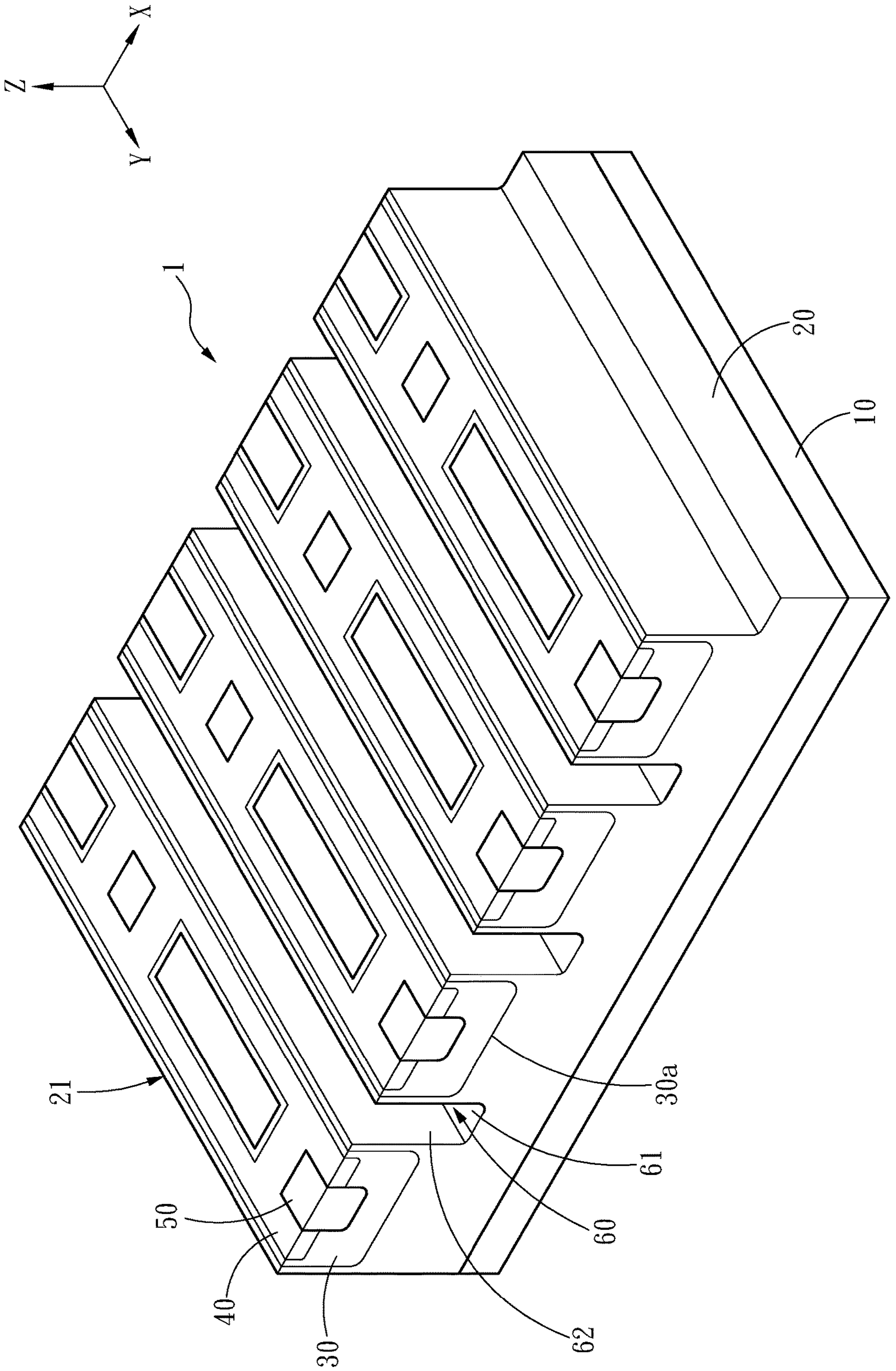
FIG. 1 illustrates a perspective view of a silicon carbide semiconductor device prior to forming the gate structure according to a first embodiment of the present disclosure.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

As used herein, the term “and/or” includes any and all combinations of one or more of the associated listed items.

In the drawings, the thickness of layers and regions are exaggerated for clarity. It will also be understood that when an element such as a layer, portion, region, or substrate is referred to as being “on” “overlie” or “atop” another element, it can be directly on, directly overlie or directly atop the other element or p elements may also be present. In contrast, when an element is referred to as being “directly on”, “directly overlie” or “directly atop” another element, there are no intervening elements present.

Relative terms such as “below”, “above”, “upper”, “lower”, “horizontal”, or “vertical” may be used herein to describe a relationship of one element, layer, portion, or region to another element, layer, portion, or region as illustrated in the figures. It will be understood that these terms and those discussed above are intended to encompass different orientations of the device in addition to the orientation depicted in the figures. A number of embodiments will be explained below, identical structural features are identified by identical or similar reference symbols in the figures. As used herein, “lateral” or “lateral direction” should be understood to mean a direction or extent that runs generally parallel to the lateral extent of the semiconductor device. The lateral direction thus extends generally parallel to its surfaces or sides. In contrast thereto, the term “thickness direction” is understood to mean a direction that runs generally perpendicular to its surfaces or sides and thus to the lateral direction.

The terminology used herein is for the purpose of describing particular embodiments only and is not intended to be limiting of the disclosure. As used herein, the singular forms “a”, “an”, and “the” are intended to include the plural forms as well, unless the context clearly indicates otherwise. It will be further understood that the terms “comprises”, “comprising”, “includes”, and/or “including” when used herein specify the presence of stated features, elements, and/or components, but do not preclude the presence or addition of one or more other features, elements, components, and/or groups thereof. The indefinite articles and the definite articles shall encompass both the plural and singular unless the opposite is clearly apparent from the context.

The terms “first conductivity type” and “second conductivity type” refer to opposite conductivity types such as N-type or P-type, however, each embodiment described and illustrated herein includes its complementary embodiment as well. Like numbers refer to like elements throughout.

Embodiments described are configured to improve the performance of the silicon carbide semiconductor device. In particular, embodiments described herein may reduce the JFET resistance of SiC MOSFET and also reduce the parasitic gate-to-drain capacitance Cgd to enhance switching performance. Moreover, the trench structure in accordance with embodiments described herein may increase total channel width density.

FIG. 1 illustrates a perspective view of a silicon carbide semiconductor device according to a first embodiment of the present disclosure. This is a schematic representation, only partially illustrating structure of the silicon carbide semiconductor device 1. The silicon carbide semiconductor device 1 comprises a SiC substrate 10, a drift layer 20, one or more first doped regions 30, one or more second doped regions 40, one or more third doped regions 50 and one or more trenchs 60.

The SiC substrate 10 has a first conductivity type (e.g., N-type) and maybe a nitrogen doped 4H-SiC substrate in an example. The drift layer 20 is disposed on the SiC substrate 10 and has the first conductivity type. The first doped regions 30 may be disposed on the drift layer 20 and adjoining to a main surface 21 of the drift layer 20. The first doped regions 30 have a second conductivity type (e.g., P-type), which is opposite to the first conductivity type. The first doped regions 30 may be formed by implanting aluminum ions as dopants into the N-type drift layer to form a counter-doped P-type region adjoining to the main surface 21 of the drift layer 20. The second doped regions 40 is formed by implanting nitrogen ions or phosphorus ions as dopants into the P-type first doped regions 30 to form a heavily doped N-type regions.

The third doped regions 50 of the second conductivity type are disposed in the first doped regions 30 and adjacent to the second doped regions 40. In an example, the drift layer 20 is N-type and has a thickness around 10 μm with a doping concentration around 8E15 $cm^{-3}$; the first doped regions 30 are P-type and has a depth of around 0.5 μm with a doping concentration around 1E17 $cm^{-3}$; and the second doped regions 40 are N-type and has a depth around 0.2 μm with a doping concentration around 1E20 $cm^{-3}$.

The trench 60 is introduced from the main surface 21 of the drift layer 20 extending right into the drift layer 20 along a thickness direction. Each of the trenches 60 has a bottom wall 61 and a sidewall 62 connected to the bottom wall 61. The bottom wall 61 of the trench 60 may be deeper than a bottom **30*a* of the first doped regions 30**.

Figure 2:
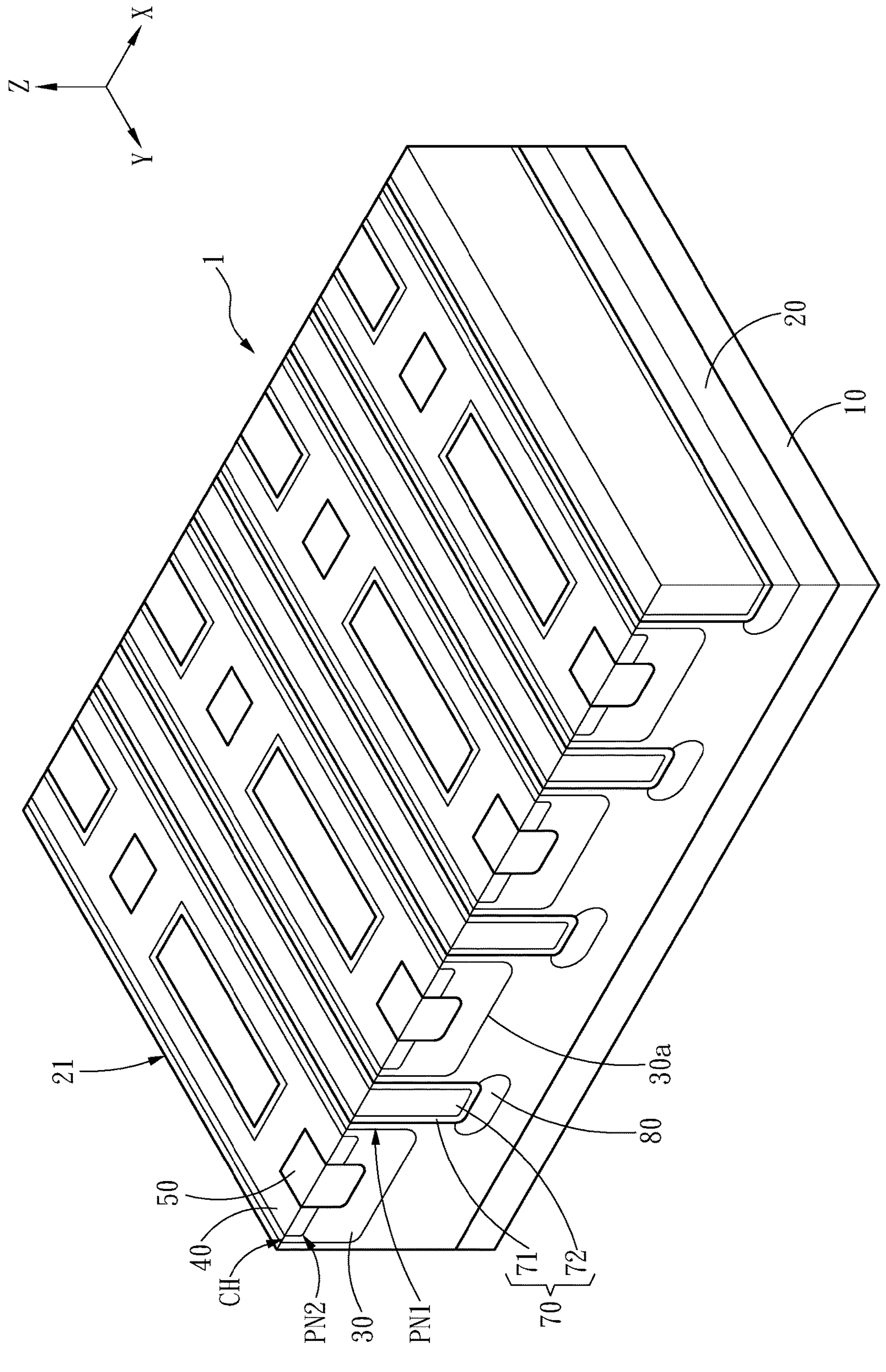
FIG. 2 illustrates a perspective view of a silicon carbide semiconductor device after the gate structure formed according to a first embodiment of the present disclosure.

Referring to FIG. 2, the first doped regions 30 form a plurality of first p-n junctions PN1 and a plurality of JFET regions with the drift layer 20 and the second doped regions 40 form a plurality of second p-n junctions PN2 with the first doped regions 30, while a plurality of channel regions CH are provided between the first p-n junctions PN1 and the second p-n junctions PN2 along the main surface 21.

The silicon carbide semiconductor device 1 further comprises one or more gate structures 70 and one or more shielding regions 80. The gate structure 70 is provided on the main surface 21 and in the trench 60, which comprises a gate insulating layer 71 and a gate electrode 72. The gate insulating layer 71 is formed on and extended over the main surface 21, the bottom wall 61 and the sidewall 62 of the trench 60 and the gate electrode 72 is formed on the gate insulating layer 71. The gate insulating layer 71 may completely insulate the gate electrode 72 from the drift layer 20. The gate insulating layer 71 may be implemented by $SiO_2$ or $SiO_xN_y$, and the gate electrode 72 may be implemented by polysilicon (poly-Si). The shielding region 80 has the second conductivity type and is disposed at a bottom of the trenches 60, the shielding region 80 is electrically coupled to the first doped regions 30, the electrical connection between the shielding region 80 and the first doped regions 30 will be described in the following other embodiments.

Figure 3:
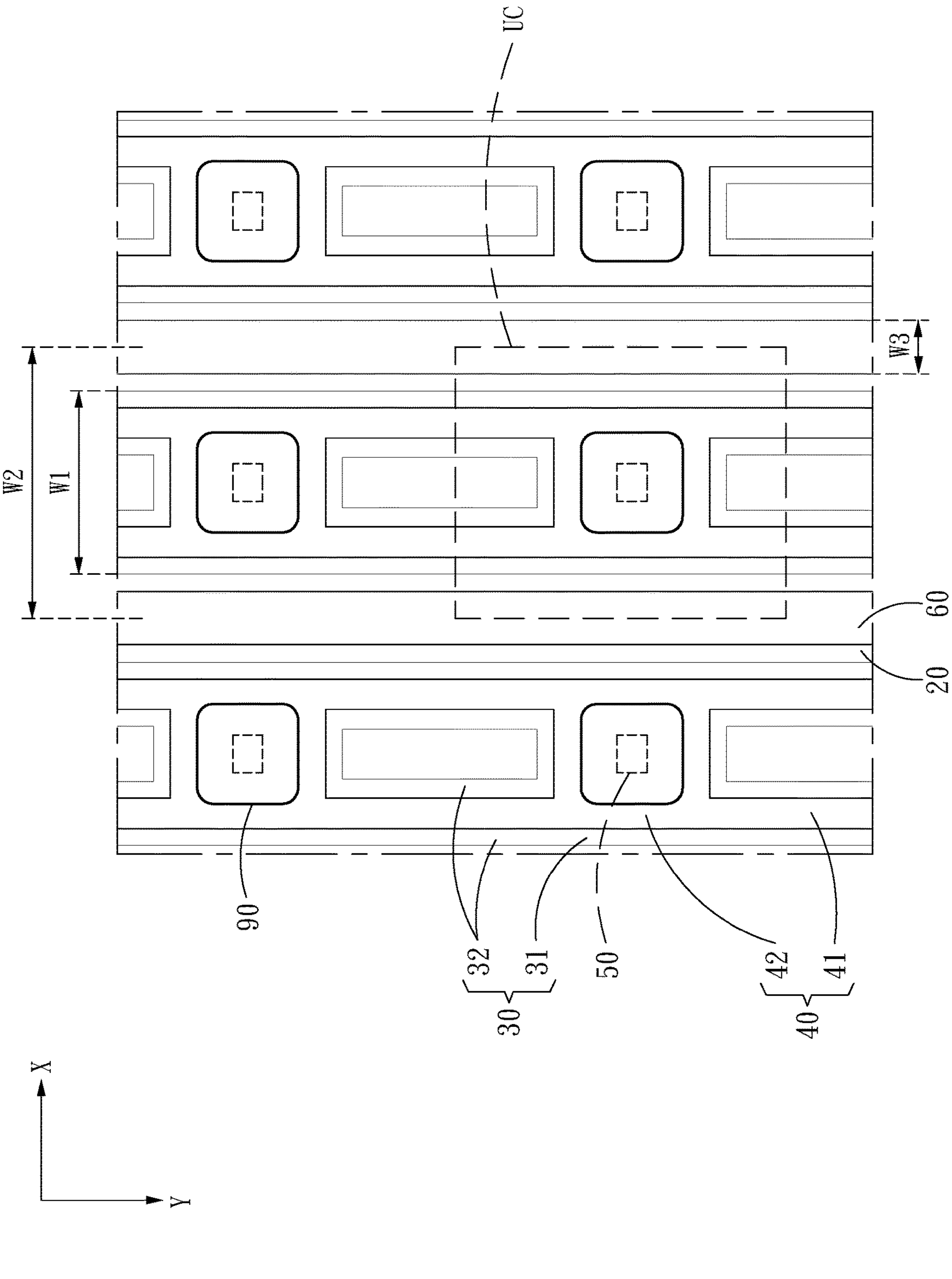
FIG. 3 illustrates a top view of the silicon carbide semiconductor device shown in FIG. 2.

FIG. 3 illustrates a top view of the silicon carbide semiconductor device shown in FIG. 2. The silicon carbide semiconductor device 1 may further comprise one or more source contacts 90 disposed on the third doped regions 50 and an area of the second doped regions 40 around the third doped regions 50. The first doped regions 30 include a plurality of first sub-portions 31 and a plurality of first extending portions 32. In the present embodiment, the first extending portions 32 are extended horizontally along a first horizontal direction (e.g. Y direction in FIG. 1) from corners of the first sub-portions 31. The second doped regions 40 comprise a plurality of second sub-portions 41 and a plurality of second extending portions 42, which are also extended horizontally along the first horizontal direction from corners of the second sub-portions 41. When viewed along a normal to the main surface 21 of the drift layer 20, each of the first doped regions 30 and the second doped regions 40 exhibits a ladder-like configuration as shown in FIG. 2. The respective ladder-like configuration extends along the first horizontal direction. The trench 60 also extends along the first horizontal direction and is in parallel with the ladder-like configuration of the first doped regions 30 and the second doped regions 40. The ladder-like configuration of the first doped regions 30 and the second doped regions 40 alternates sequentially with the trenches 60. In addition, the first doped region 30 is transversely spaced from the trench 60 by a distance equal to or larger than 1 nm.

In terms of the layout of the first doped region 30, the second doped regions 40 and the third doped regions 50, the silicon carbide semiconductor device 1 comprises a plurality of unit cells UC, which are the minimum unit structure of the silicon carbide semiconductor device 1 (e.g., MOSFET) arranged in an active region. In an embodiment, the first doped region 30 may have a width W1 ranging between 0.5 μm and 10 μm, the unit cell UC may have a cell pitch W2 ranging between 1 μm and 20 μm, and the trench 60 may have a trench width W3 ranging between 0.2 μm and 10 μm.

The embodiment of FIGS. 1 to 3 shows a non-limiting example of the hybrid gate semiconductor device according to the present disclosure. The hybrid gate comprises a planar gate structure formed along XY plane around the source contact 90 and a trench gate structure formed along XZ plane and/or YZ plane around the trench 60. The planar gate structure contributes to a lateral channel and the trench gate structure reduces the JFET resistance, because an accumulation layer along the sidewalls 62 of the trenches 60 will be formed when a positive gate bias voltage is applied. The accumulation layer has a carrier density much higher than the doping of drift layer 20 and provides a low resistance current path from a drain electrode to a source electrode of SiC MOSFET. In addition to that, the shielding region 80 of the embodiment in FIG. 2 reduces the gate-to-drain capacitance Cgd, which will reduce the turn-on and turn-off switching time and switching loss. As a result, the channel density of the hybrid gate semiconductor device is the same compared to the conventional structure with the same cell pitch, but the JFET resistance and the parasitic gate-to-drain capacitance Cgd are reduced owing to the hybrid gate configuration and thus the total on-resistance and switching performance are enhanced. The lower JFET resistance and the parasitic capacitance of the SiC devices of the embodiment herein as compared to the conventional SiC devices make them highly desirable in high power applications.

Figure 4:
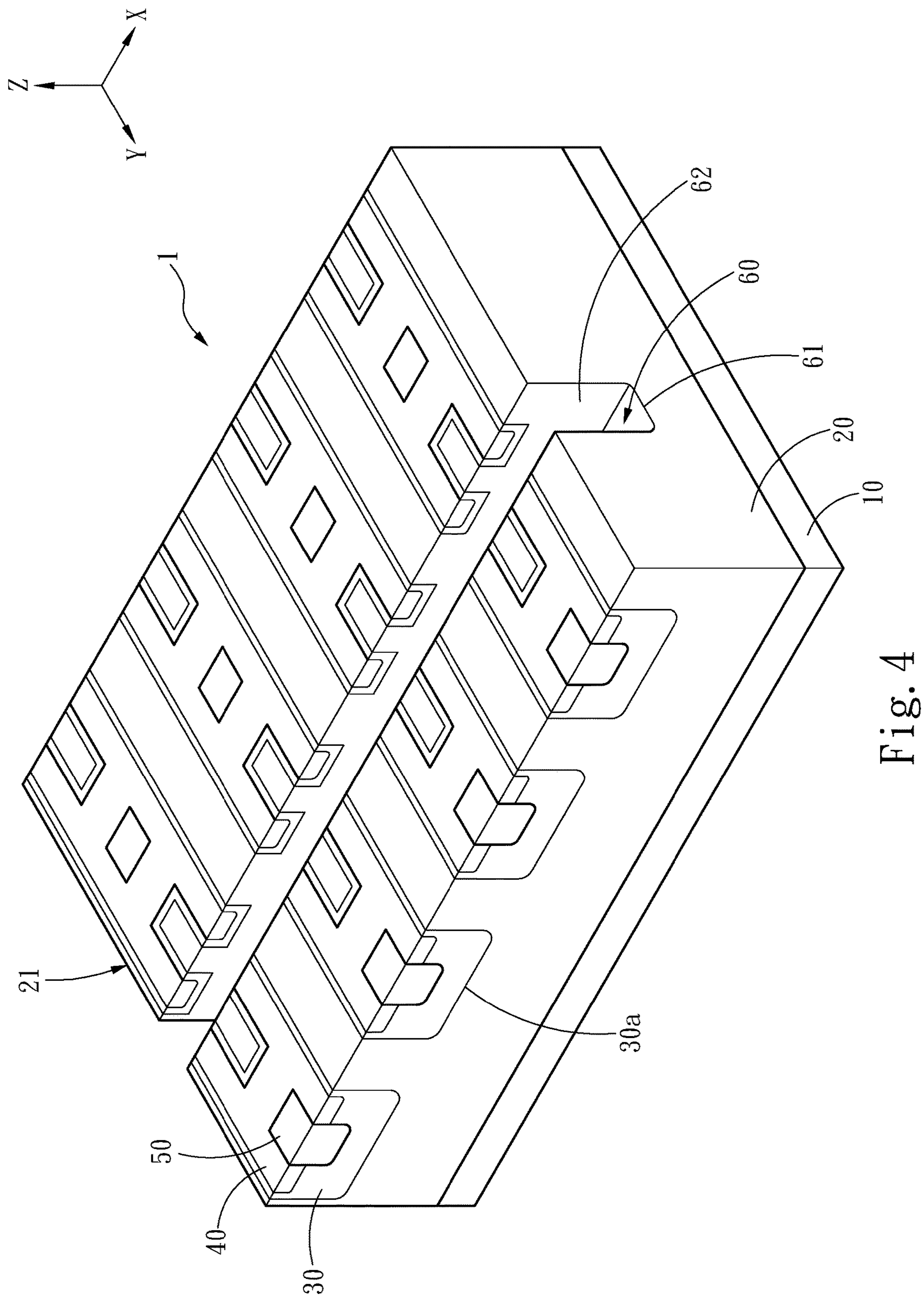
FIG. 4 illustrates a perspective view of a silicon carbide semiconductor device prior to forming the gate structure according to a second embodiment of the present disclosure.
Figure 5:
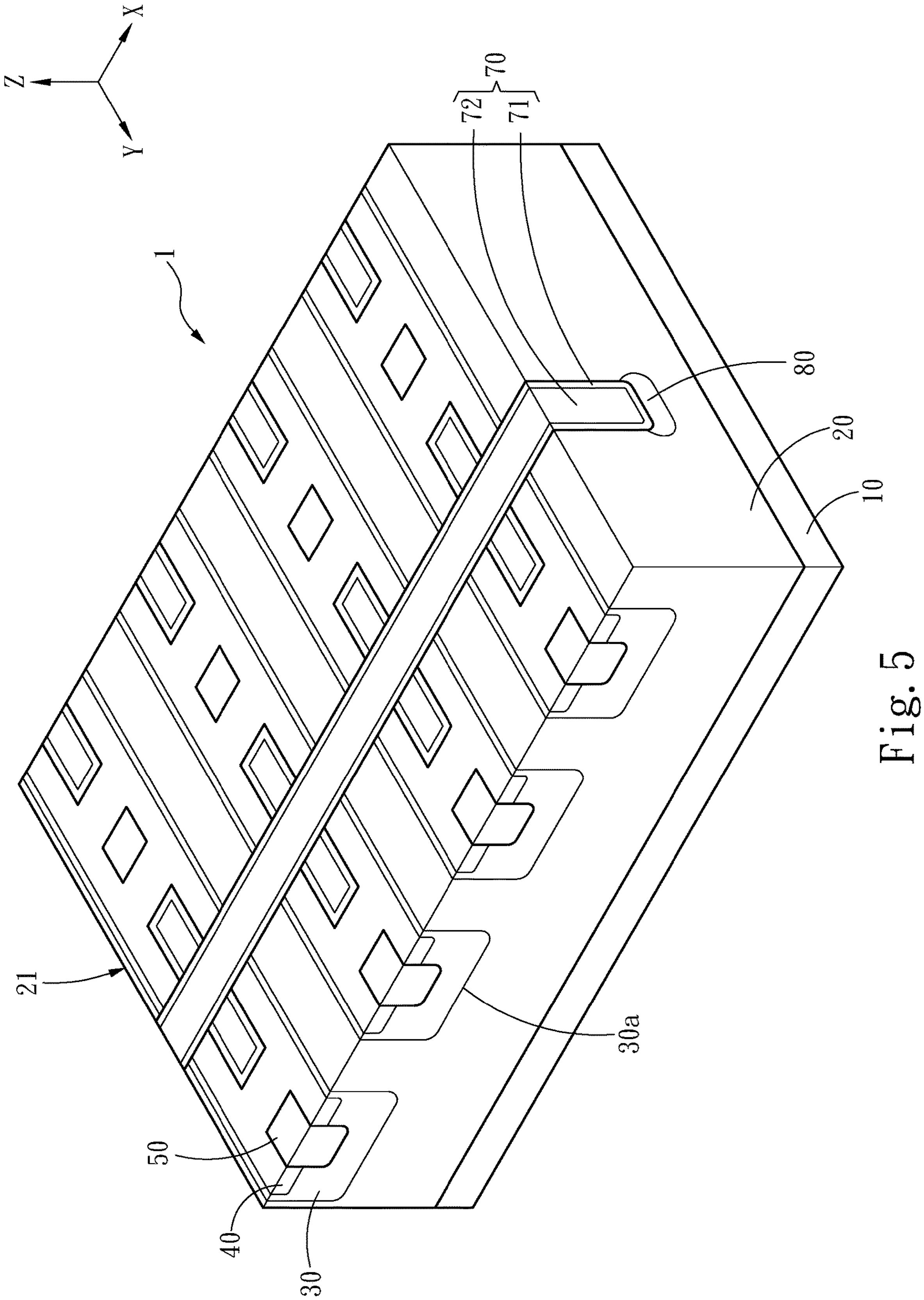
FIG. 5 illustrates a perspective view of a silicon carbide semiconductor device after the gate structure formed according to a second embodiment of the present disclosure.
Figure 6:
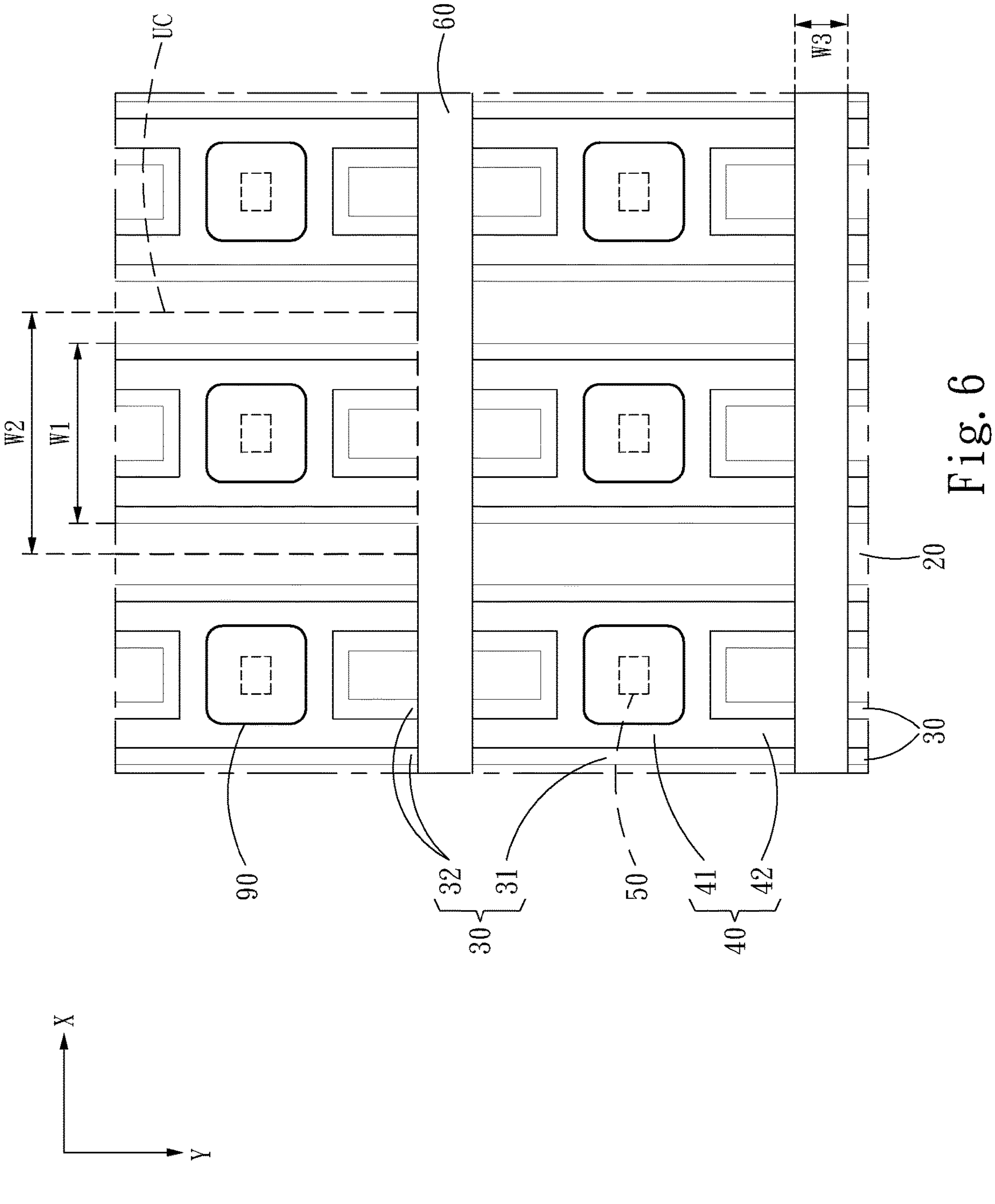
FIG. 6 illustrates a top view of the silicon carbide semiconductor device shown in FIG. 5.

FIGS. 4 to 6 illustrate a second embodiment of the present disclosure. In contrast to the first embodiment, the trench 60 extends along a second horizontal direction (e.g. X direction in FIG. 4) and is perpendicular to the ladder-like configuration of the first doped regions 30 and the second doped regions 40 when viewed along a normal to the main surface 21 of the drift layer 20. The trench 60 in the present embodiment runs across the first extending portions 32 of the first doped regions 30 and the second extending portions 42 of the second doped regions 40 and is disposed between the first sub-portions 31 of the first doped regions 30 and the second sub-portions 41 of the second doped regions 40.

In an embodiment, the first doped region 30 may have a width W1 ranging between 0.5 μm and 10 μm, the unit cell UC may have a cell pitch W2 ranging between 1 μm and 20 μm, and the trench 60 may have a trench width W3 ranging between 0.2 μm and 10 μm. The disclosed embodiment herein provides a silicon carbide semiconductor device 1 (e.g., MOSFET) with increasing total channel width density. In one example, the first extending portions 32 of the first doped region 30 has a width of 2 μm, the depth of the first doped region 30 is 0.7 μm and the trench width is 1 μm. Referring to FIG. 4, by providing the trenches 60, some of the lateral channel width will be sacrificed because of the trench structure. Assuming the trench width W3 is 1 μm, the change of the lateral channel width may be represented by:

$$-4\times 1\ \mu\text{m} = -4\ \mu\text{m}$$

But the trench structure also creates vertical channels on both side of the sidewalls 62 of the trench 60. Assuming the depth of the first doped region 30 is 0.7 μm and the width of the first extending portions 32 is 2 μm, the change of the vertical channel width may be represented by:

$$+2\times(4\times 0.7\ \mu\text{m} + 2\times 2\ \mu\text{m}) = +13.6\ \mu\text{m}$$

Therefore, by providing one trench for each ladder-like configuration of the first doped region 30, the channel width will increase by 9.6 μm. The total channel width can be further increased by providing more trenches.

The embodiment of FIGS. 4 to 6 shows a non-limiting example of the hybrid gate semiconductor device according to the present disclosure. The hybrid gate comprises a planar gate structure formed along XY plane around the source contact 90 and a trench gate structure formed along XZ plane and/or YZ plane around the trench 60. The planar gate structure contributes to a lateral channel and the trench gate structure contributes to a vertical channel. In addition to that, the shielding region 80 of the embodiment in FIG. 5 reduces the gate-to-drain capacitance Cgd, which will reduce the turn-on and turn-off switching time and switching loss. As a result, the channel density of the hybrid gate semiconductor device is higher compared to the conventional structure with the same cell pitch, the JFET resistance and the parasitic gate-to-drain capacitance Cgd are also reduced owing to the hybrid gate configuration and thus the total on-resistance and switching performance are enhanced. The lower channel resistance and the parasitic capacitance of the SiC devices of the embodiment herein as compared to the conventional SiC devices make them highly desirable in high power applications.

Figure 7:
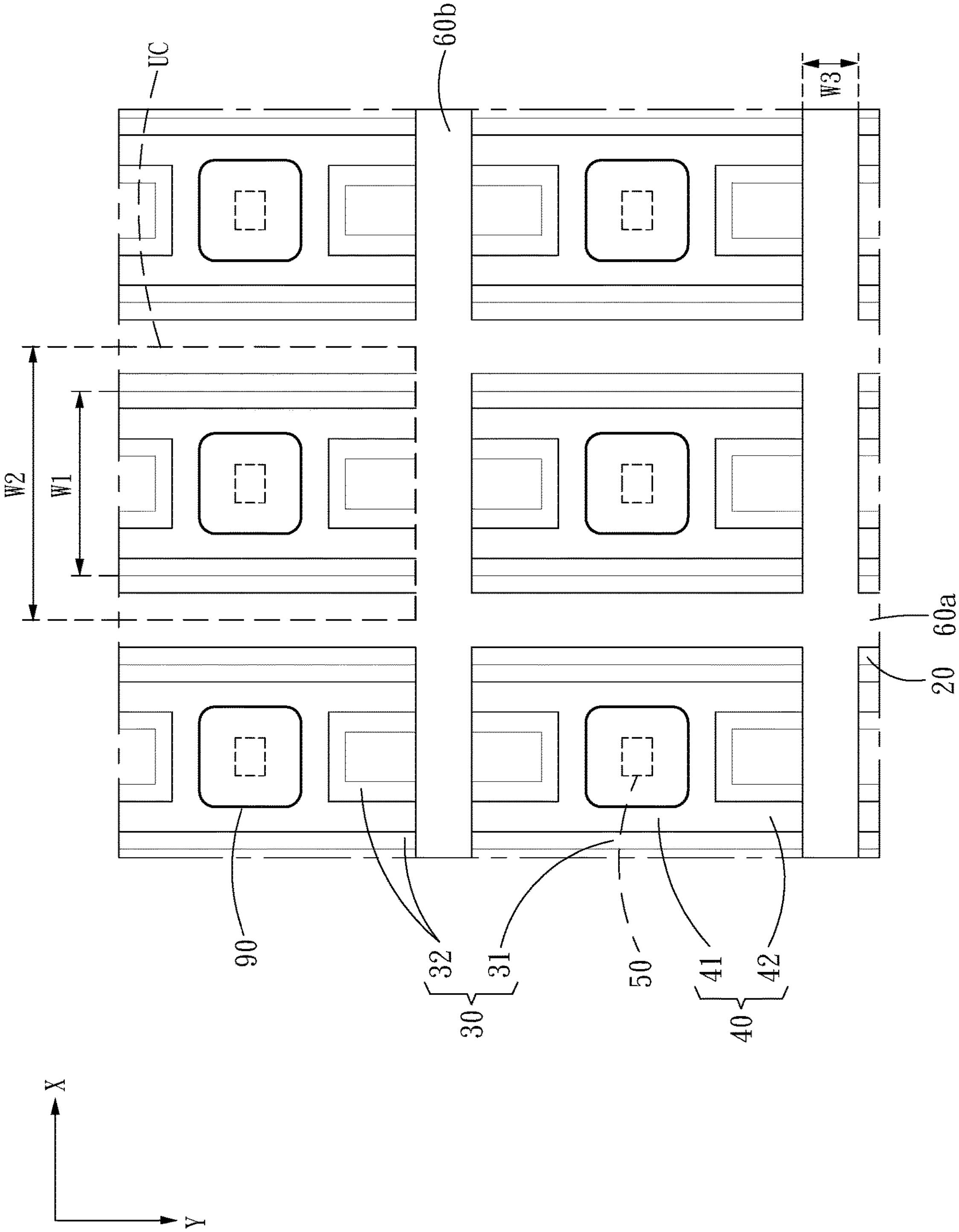
FIG. 7 illustrates a top view of the silicon carbide semiconductor device according to a third embodiment of the present disclosure.

FIG. 7 illustrates a third embodiment of the present disclosure. The present embodiment may be treated as a combination of the first and second embodiments. The trenches 60 include a first group 60*a* and a second group 60*b*. The first group 60*a* of the trenches 60 runs substantially along the first horizontal direction, and the second group 60*b* of the trench 60 runs substantially along the second horizontal direction. The first group 60*a* of the trenches 60 is disposed between the ladder-like structure of the ladder-like configuration of the first doped regions 30 and the second doped regions 40, while the second group 60*b* of the trenches 60 is disposed across the ladder-like structure of the ladder-like configuration of the first doped regions 30 and the second doped regions 40, such that a net-like structure of the trenches 60 is formed. The first group 60*a* and the second group 60*b* of the trenches 60 are interconnected. The trench widths and the depths of the first group 60*a* and the second group 60*b* may be same or different to optimize the performance of the silicon carbide semiconductor device 1.

In an embodiment, the first doped region 30 may have a width W1 ranging between 0.5 μm and 10 μm, the unit cell UC may have a cell pitch W2 ranging between 1 μm and 20 μm, and the trench 60 may have a trench width W3 ranging between 0.2 μm and 10 μm. The disclosed embodiment herein provides a silicon carbide semiconductor device 1 (e.g., MOSFET) with reduced channel resistance, JFET resistance and Cgd.

The configuration of the first doped regions 30 and the second doped regions 40 are not necessarily ladder-like but may be other geometries.

Figure 8:
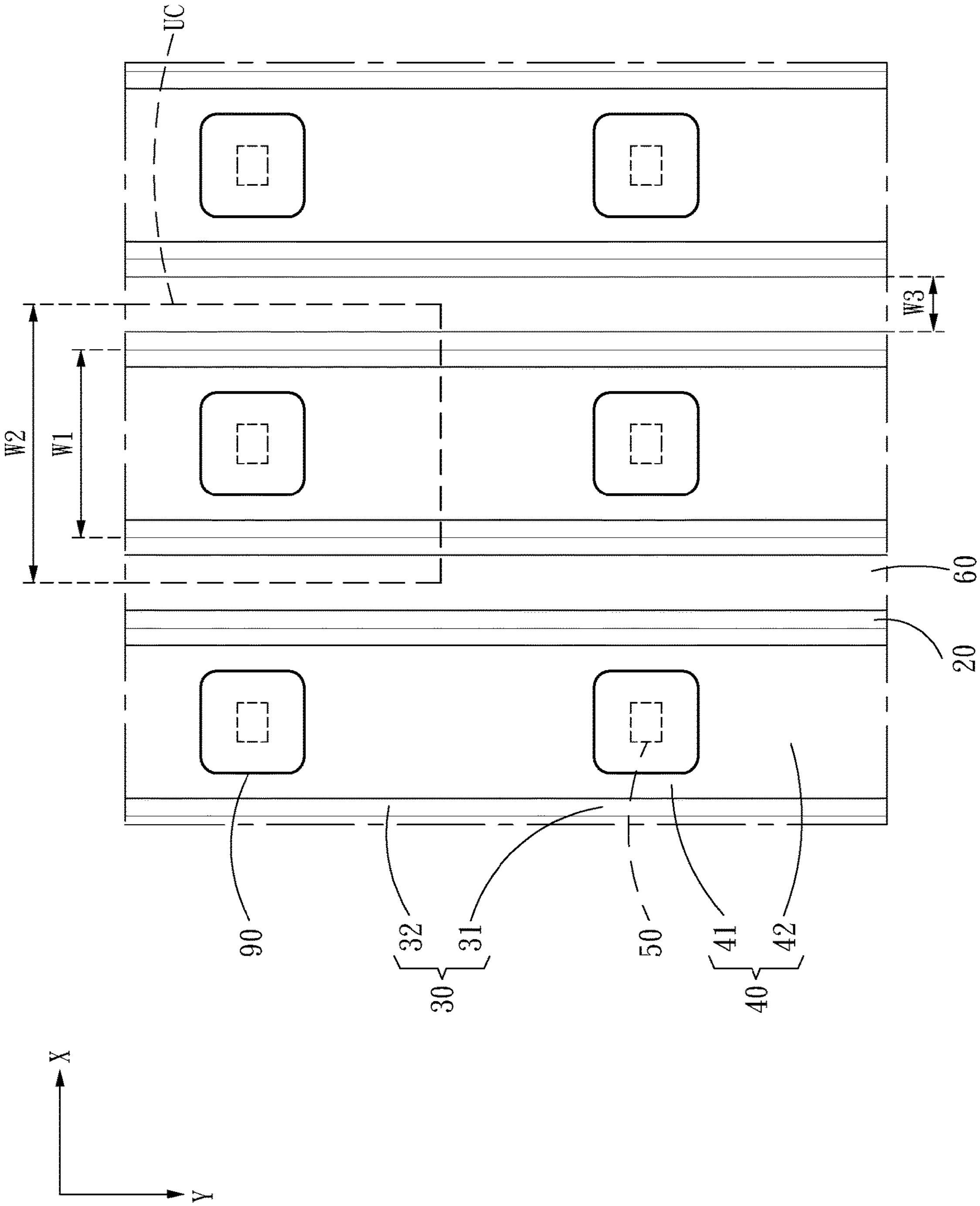
FIG. 8 illustrates a top view of the silicon carbide semiconductor device according to a fourth embodiment of the present disclosure.

FIG. 8 illustrates a fourth embodiment of the present disclosure. In the present embodiment, the first extending portions 32 are extended horizontally along the first horizontal direction from a front and a back of the first sub-portions 31, and the second extending portions 42 are also extended horizontally along the first horizontal direction from a front and a back of the second sub-portions 41. When viewed along a normal to the main surface 21 of the drift layer 20, each of the first doped regions 30 and the second doped regions 40 exhibits a stripe configuration as shown in FIG. 8. The respective stripe configuration extends along the first horizontal direction. The trench 60 also extends along the first horizontal direction and is in parallel with the stripe configuration of the first doped regions 30 and the second doped regions 40. The stripe configuration of the first doped regions 30 and the second doped regions 40 alternates sequentially with the trenches 60.

Various possible alternatives to the fourth embodiment may be made, for example, the trench 60 may be arranged and extended along the second horizontal direction and is perpendicular to the stripe configuration of the first doped regions 30 and the second doped regions 40 when viewed along a normal to the main surface 21 of the drift layer 20. Otherwise, the trenches 60 may include a first group 60*a* and a second group 60*b* to form a net-like structure, as shown in FIG. 7.

Figure 9:
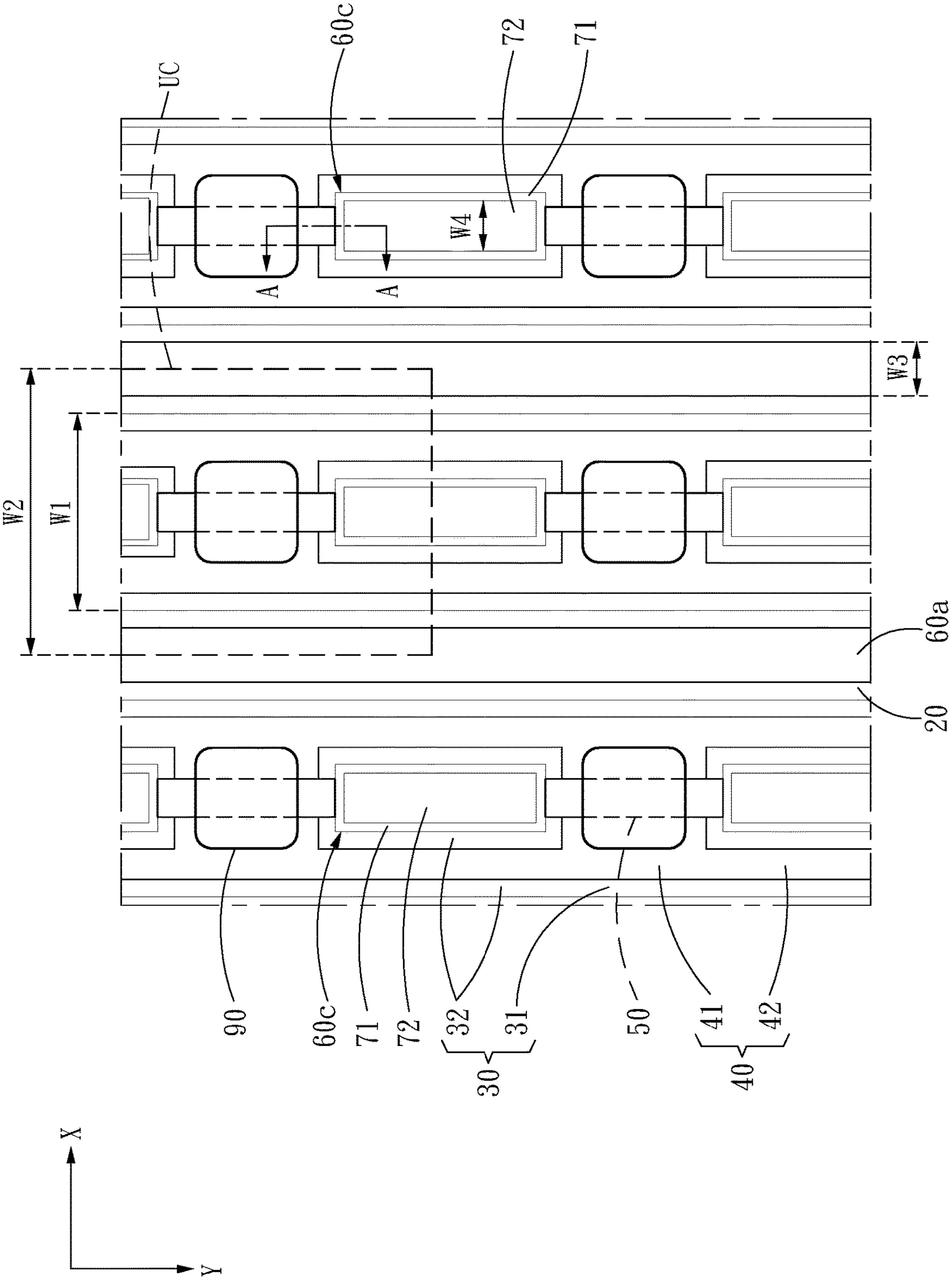
FIG. 9 illustrates a top view of the silicon carbide semiconductor device according to a fifth embodiment of the present disclosure.

FIG. 9 illustrates a fifth embodiment of the present disclosure. Compared to the first embodiment, the trenches 60 includes a first group 60*a* and a third group 60*c*. The first group 60*a* of the trenches 60 runs substantially and continuously along the first horizontal direction as shown in the first embodiment, and the third group 60*c* of the trenches 60 runs substantially and intermittently along the first horizontal direction.

When viewed along a normal to the main surface 21 of the drift layer 20, each of the first doped regions 30 and the second doped regions 40 exhibits a ladder-like configuration as shown in FIG. 9. The respective ladder-like configuration extends along the first horizontal direction. The first group 60*a* of the trenches 60 is disposed between the ladder-like configurations. When viewed along the second horizontal direction, it can be seen that the first group 60*a* of the trench 60 alternates sequentially with the ladder-like configuration of the first doped regions 30 and the second doped regions 40. Each of the third group 60*c* of the trenches 60 may include one or more trench segments along the first horizontal direction, which are disposed in the drift layer 20 enclosed by the first sub-portions 31 and the first extending portions 32.

In the present embodiment, the third doped region 50 is extended along the first horizontal direction to the ends of the third group 60*c* of the trenches 60. In FIG. 9, there is only single third doped region 50 under the source contacts 90, but the third doped region 50 may be split by two to increase the contact area between the second doped region 40 and the source contacts 90.

In an embodiment, the first doped region 30 may have a width W1 ranging between 0.5 μm and 10 μm, the unit cell UC may have a cell pitch W2 ranging between 1 μm and 20 μm, the first group 60*a* of the trenches 60 may have a trench width W3 ranging between 0.2 μm and 10 μm, and the third group 60*c* of the trenches 60 may have a trench width W4 ranging between 0.2 μm and 10 μm.

Figure 10:
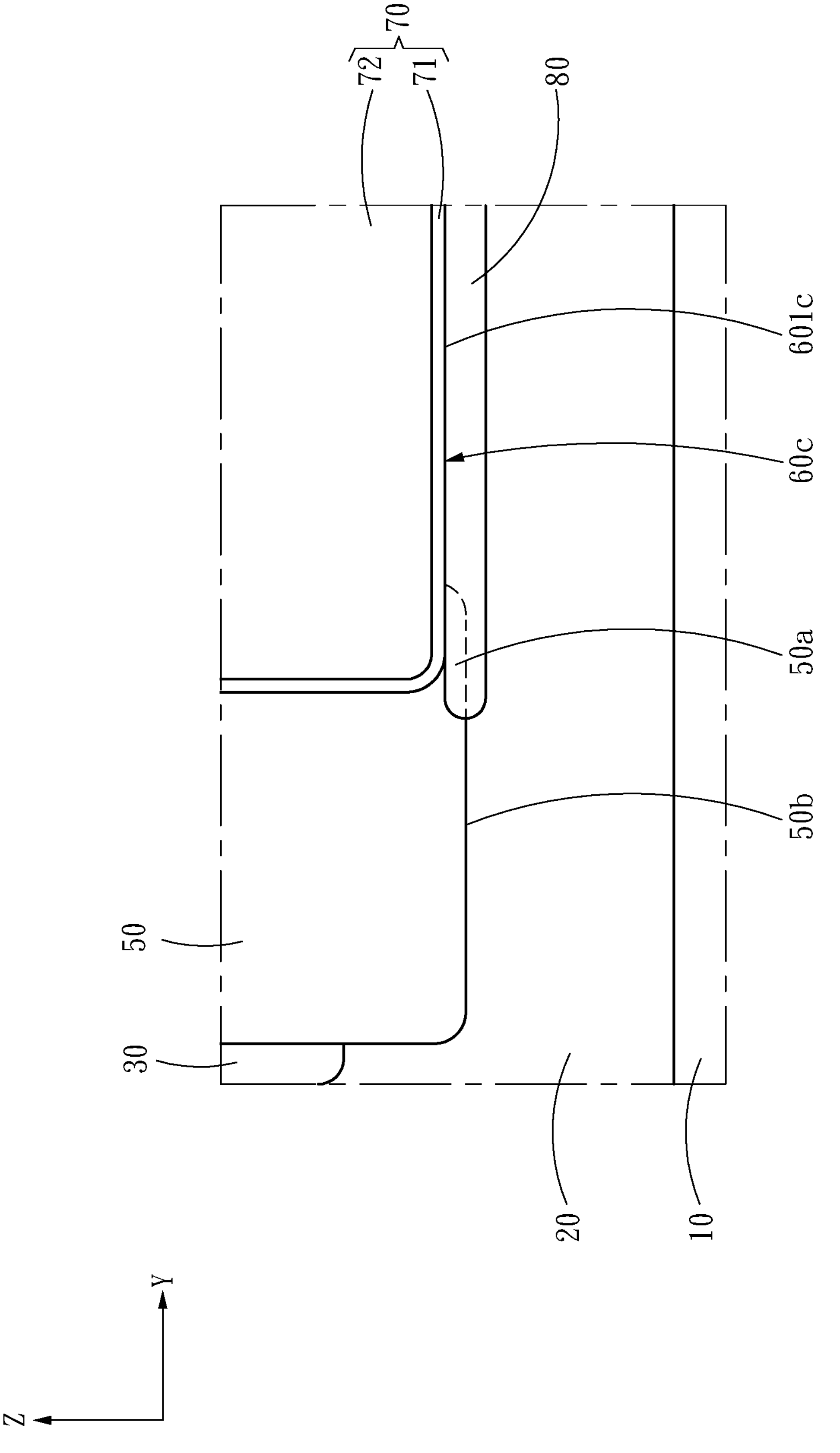
FIG. 10 shows a schematic vertical cross-sectional view of a portion along the line A-A of FIG. 9.

FIG. 10 shows a schematic vertical cross-sectional view of a portion along the line A-A of FIG. 9, which also illustrates the gate structure 70 formed in the trench 60 and the shielding region 80 underneath the trench 60 and the gate structure 70. The shielding region 80 extends along the bottom of the trench 60 and forms an electrical connection with the third doped region 50 extended to an end of the trenches 60.

FIG. 10 shows that a portion 50*a* of the third doped region 50 located below the trench 60 overlaps the shielding region 80. In terms of the manufacturing process in an example, the first doped region 30, the second doped region 40 and the third doping region 50 are formed in succession, and then the trench 60 is formed in the third doping region 50 by etching, and the shielding region 80 is formed below the trench 60. Since a bottom 50*b* of the third doped region 50 is deeper than a bottom 601*c* of the trench 60, after the trench 60 is formed, a sacrifice portion of the third doped region 50 is removed during etching the trench 60, while the portion 50*a* is preserved and located beneath the trench 60. After the shielding region 80 is formed, since both are P-type doped regions, the portion 50*a* of the third doped region 50 will inherently form an electrical contact with the shielding region 80.

Figure 11:
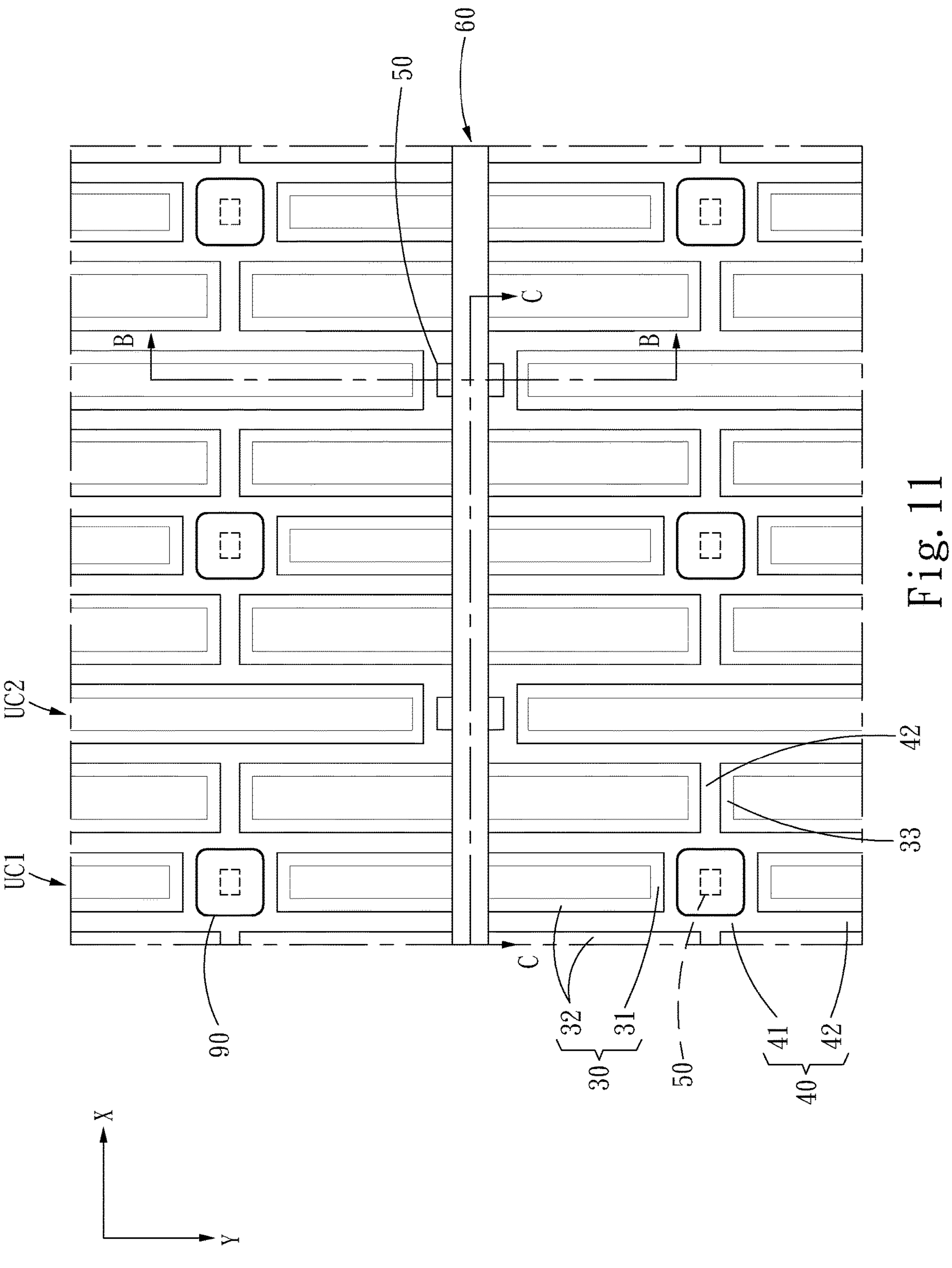
FIG. 11 illustrates a top view of the silicon carbide semiconductor device according to a sixth embodiment of the present disclosure.

FIG. 11 illustrates a sixth embodiment of the present disclosure. The first doped regions 30 includes a plurality of first sub-portions 31, a plurality of first extending portions 32 and a plurality of first connecting portions 33. The second doped regions 40 comprise a plurality of second sub-portions 41, a plurality of second extending portions 42 and a plurality of second connecting portions 43. The first extending portions 32 and the second extending portions 42 are extended horizontally along the first horizontal direction from corners of the first sub-portions 31 and the second sub-portions 41, respectively. The first connecting portions 33 and the second connecting portions 43 are extended horizontally along the second horizontal direction from two sides of the first sub-portions 31 and the second sub-portions 41, respectively.

The unit cells of the layout of the first doped regions 30 and the second doped regions 40 include a first unit cells UC1 and a second unit cells UC2, which are arrayed in a staggered pattern at intervals. The source contacts 90 are disposed on the third doped regions 50 in the first unit cells UC1. The trenches 60 extend along the second horizontal direction and pass through the third doped region 50 in the second unit cell UC2. That is, the trenches 60 are configured to be between and in parallel with an alignment direction of the third doped region 50 in the first unit cell UC1.

Figure 12:
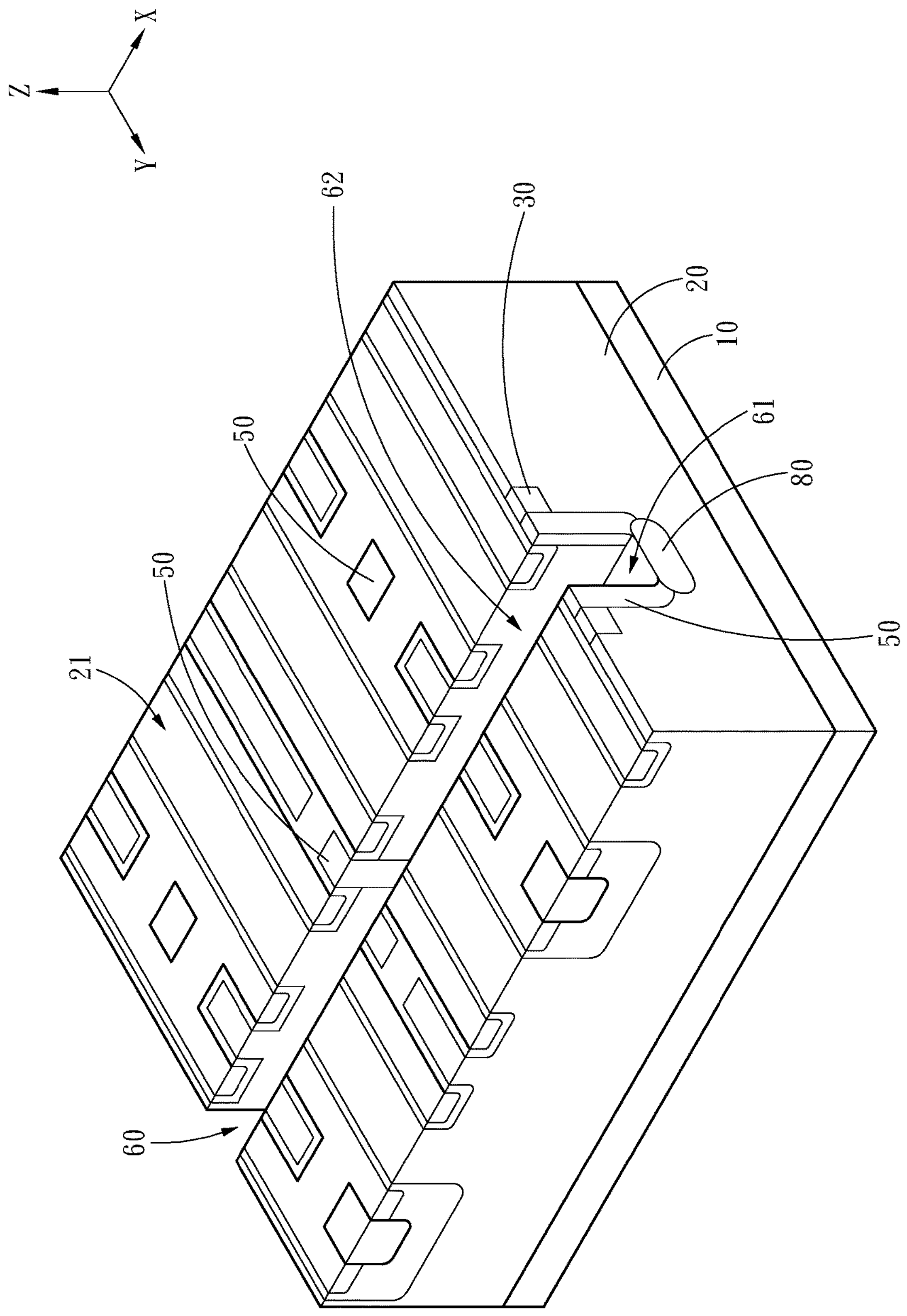
FIG. 12 shows a schematic vertical cross-sectional view of a portion along the line B-B of FIG. 11.
Figure 13:
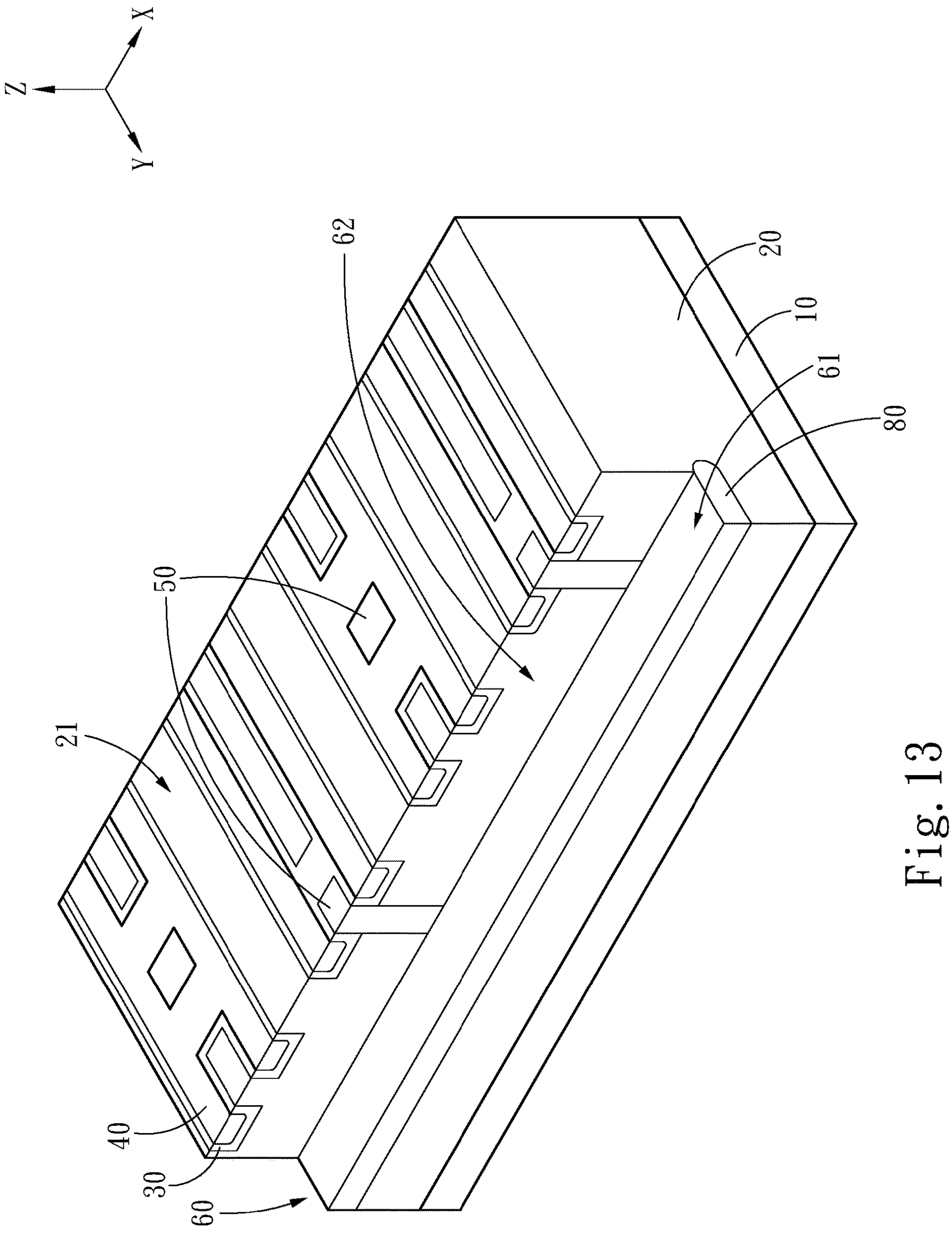
FIG. 13 shows a schematic vertical cross-sectional view of a portion along the line C-C of FIG. 11.

FIG. 12 and FIG. 13 show schematic vertical cross-sectional views of portions along the line B-B and C-C of FIG. 11. In the present embodiment, the third doped region 50 in the second unit cell UC2 is provided deep enough to connect with the shielding region 80 underneath the trench 60, so as to achieve an electrical connection between the first doped region 30 and the shielding region 80.

Figure 14:
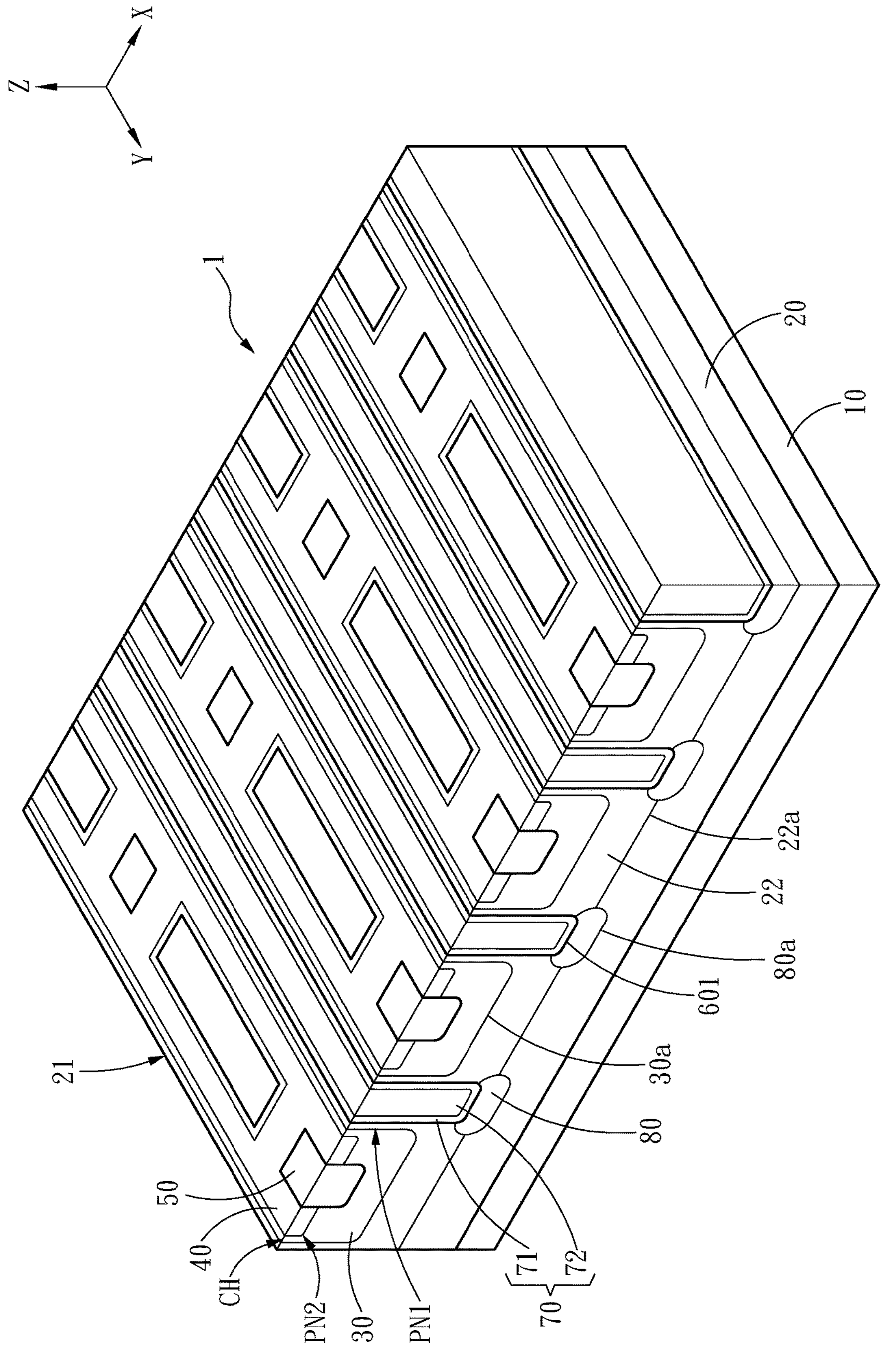
FIG. 14 is a perspective view of a silicon carbide semiconductor device according to a seventh embodiment of the present disclosure.

FIG. 14 shows yet another embodiment, the drift layer 20 further comprises a current spreading layer 22. The current spreading layer 22 has a doping concentration higher than a remaining portion of the drift layer 20. In one example, a depth of the first doped region 30 is 0.6 μm, a depth of the trenches 60 is 1 μm, and a depth of the shielding region 80 is 0.2 μm. That is, a bottom 80*a* of the shielding region 80 is below a bottom 601 of the trench 60. A doping concentration of the drift layer 20 is 8E15 $cm^{-3}$, a doping concentration of the current spreading layer 22 is 1E17 $cm^{-3}$, and a depth of the current spreading layer 22 is provided as 1 μm. That is, a bottom 22*a* of the current spreading layer 22 is lower than a bottom 30*a* of the first doped region 30, and higher than the bottom 80*a* of the shielding region 80.

Although specific embodiments and examples have been illustrated and described herein, it will be appreciated by those of ordinary skill in the art that a variety of alternate and/or equivalent implementations may be substituted for the specific embodiments and examples shown and described without departing from the scope of the present invention. This application is intended to cover any adaptations or variations of the specific embodiments and examples discussed herein. Therefore, it is intended that this invention be limited only by the claims and the equivalents thereof.

What is claimed is:

1. A silicon carbide semiconductor device, comprising:

a silicon carbide substrate;

a drift layer of a first conductivity type disposed on the silicon carbide substrate, the drift layer has a main surface;

a plurality of first doped regions of a second conductivity type opposite to the first conductivity type disposed in the drift layer, the first doped regions comprising a plurality of first sub-portions and a plurality of first extending portions extended horizontally along a first horizontal direction from the first sub-portions, the first doped regions forming a plurality of first p-n junctions and a plurality of JFET regions with the drift layer;

a plurality of second doped regions of the first conductivity type disposed within the first doped regions, the second doped regions comprising a plurality of second sub-portions and a plurality of second extending portions extended horizontally along the first horizontal direction from the second sub-portions, the second doped regions forming a plurality of second p-n junctions with the first doped regions, a plurality of channel regions being provided between the first p-n junctions and the second p-n junctions along the main surface;

a plurality of third doped regions of the second conductivity type disposed in the first sub-portions of the first doped regions and adjacent to the second sub-portions of the second doped regions;

a plurality of trenches penetrating from the main surface into the drift layer, the plurality of trenches running horizontally through at least a portion of the JFET regions, wherein surfaces of the trenches are formed with the drift layer; and a gate electrode disposed in each of the trenches, the gate electrode being electrically isolated from the drift layer by a gate insulating layer, wherein the gate electrode is extended from the main surface to the gate insulating layer, and a top surface of the gate electrode is as high as the main surface;

wherein a distance between a sidewall of the trench and the first extending portion is equal to or larger than 1 nm.

2. The silicon carbide semiconductor device of claim 1, wherein each of the first sub-portions and each of the second sub-portions are connected by one or more first extending portions and one or more second extending portions, respectively.

3. The silicon carbide semiconductor device of claim 1, wherein each of the first sub-portions and each of the second sub-portions are connected by at least four first extending portions and at least four second extending portions, respectively.

4. The silicon carbide semiconductor device of claim 1, wherein the first extending portions of the first doped regions and the second extending portions of the second doped regions extend along the first horizontal direction, and the trenches run substantially parallelly to the first extending portions and the second extending portions.

5. The silicon carbide semiconductor device of claim 1, wherein the trenches run along a second horizontal direction orthogonal to the first horizontal direction.

6. The silicon carbide semiconductor device of claim 1, wherein the trenches include a first group and a second group, which run substantially along the first horizontal direction and a second horizontal direction orthogonal to the first horizontal direction.

7. The silicon carbide semiconductor device of claim 1, wherein the first doped region and the second doped region further comprise a plurality of first connecting portions and a plurality of second connecting portions respectively, the first connecting portions and the second connecting portions extend horizontally along a second horizontal direction from the first sub-portions and the second sub-portions.

8. The silicon carbide semiconductor device of claim 1, wherein a bottom of the trench is deeper than a bottom of the first doped region.

9. The silicon carbide semiconductor device of claim 1, wherein further comprising a plurality of shielding regions having the second conductivity type disposed at a bottom of the trenches, the shielding regions being electrically coupled to the first doped region.

10. The silicon carbide semiconductor device of claim 1, wherein the drift layer further comprises a current spreading layer of the first conductivity type, the current spreading layer is proximate to the main surface and has a doping concentration higher than that of a remaining portion of the drift layer.

11. The silicon carbide semiconductor device of claim 10, wherein a bottom of the current spreading layer is deeper than a bottom of the first doped region and shallower than a bottom of a shielding region.

* * * * *